(12) United States Patent
Kim

(10) Patent No.: US 11,469,196 B2
(45) Date of Patent: Oct. 11, 2022

(54) SEMICONDUCTOR PACKAGE INCLUDING SEMICONDUCTOR CHIP HAVING POINT SYMMETRIC CHIP PADS

(71) Applicant: SK hynix Inc., Icheon-si (KR)

(72) Inventor: Jun Sik Kim, Icheon-si (KR)

(73) Assignee: SK hynix Inc., Icheon-si Gyeonggi-do (KR)

( * ) Notice: Subject to any disclaimer, the term of this patent is extended or adjusted under 35 U.S.C. 154(b) by 101 days.

(21) Appl. No.: 16/941,305

(22) Filed: Jul. 28, 2020

(65) Prior Publication Data

US 2021/0257323 A1    Aug. 19, 2021

(30) Foreign Application Priority Data

Feb. 13, 2020    (KR) ........................ 10-2020-0017892

(51) Int. Cl.
*H01L 23/00*    (2006.01)
*H01L 23/498*    (2006.01)
*H01L 25/065*    (2006.01)

(52) U.S. Cl.
CPC ........ *H01L 24/06* (2013.01); *H01L 23/49838* (2013.01); *H01L 24/32* (2013.01); *H01L 24/48* (2013.01); *H01L 24/49* (2013.01); *H01L 24/73* (2013.01); *H01L 25/0657* (2013.01); *H01L 2224/0612* (2013.01); *H01L 2224/32145* (2013.01); *H01L 2224/48227* (2013.01); *H01L 2224/49176* (2013.01); *H01L 2224/73215* (2013.01); *H01L 2224/73265* (2013.01)

(58) Field of Classification Search
CPC ........................ H01L 25/0657; H01L 23/5286
See application file for complete search history.

(56) References Cited

U.S. PATENT DOCUMENTS

| | | | |
|---|---|---|---|
| 7,948,073 B2 | 5/2011 | Chen | |
| 2015/0255381 A1* | 9/2015 | Kim | ................. H01L 23/49575 257/676 |
| 2018/0026506 A1 | 1/2018 | Zhang et al. | |

* cited by examiner

*Primary Examiner* — Yu-Hsi D Sun
(74) *Attorney, Agent, or Firm* — William Park & Associates Ltd.

(57) ABSTRACT

A semiconductor package according to an aspect of the present disclosure includes a package substrate and a plurality of semiconductor chips stacked on the package substrate. Each of the semiconductor chips includes a chip body, at least one first side power pad and at least one first side ground pad that are disposed on a first side portion on one surface of the chip body, and at least one second side power pad and at least one second side ground pad that are disposed on a second side portion opposite to the first side portion on one surface of the chip body. One of the second side power pads is disposed point-symmetrically to corresponding one of the first side power pads with respect to a reference point on the one surface, and one of the second side ground pads is disposed point-symmetrically to corresponding one of the first side ground pads with respect to a reference point on the one surface.

19 Claims, 6 Drawing Sheets

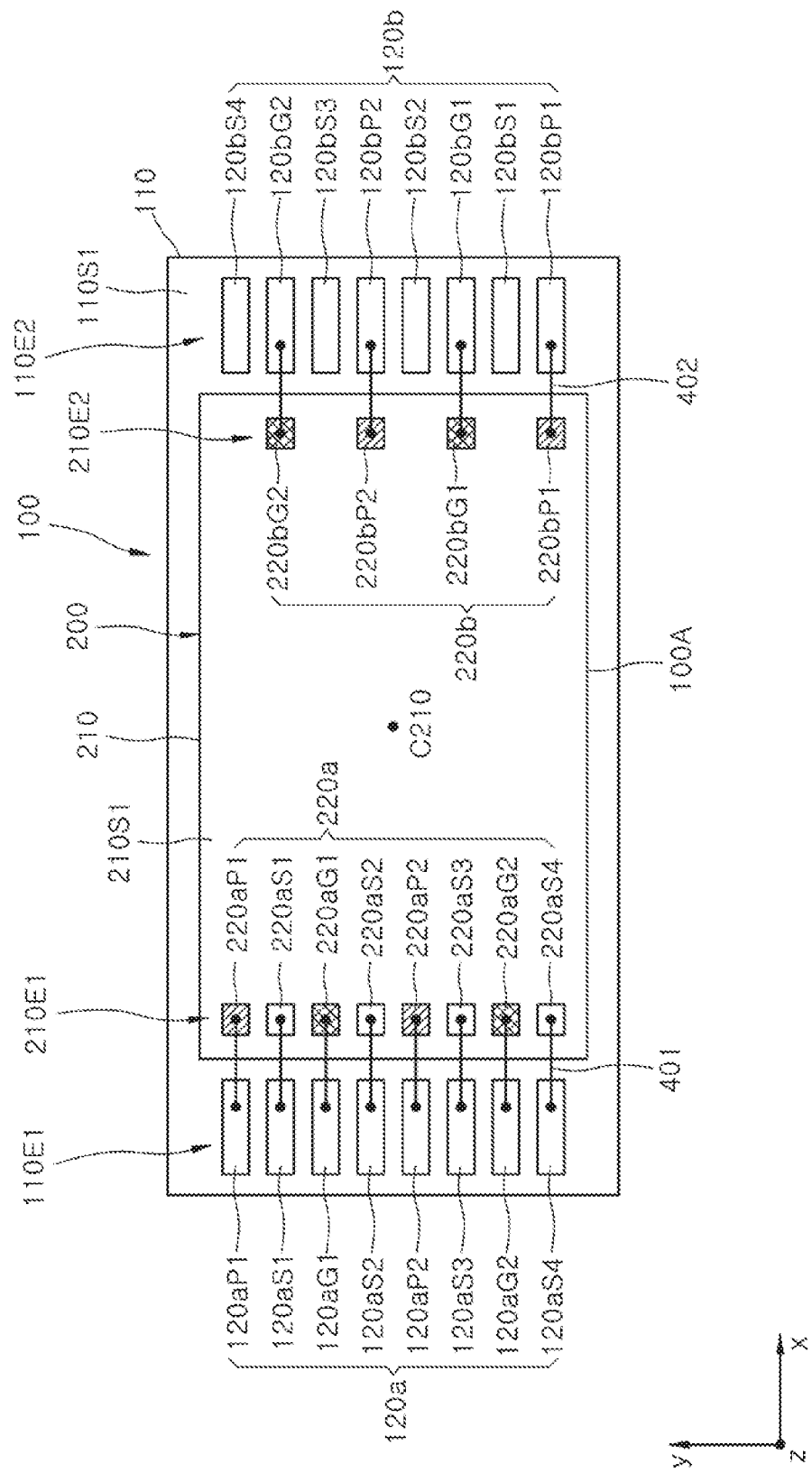

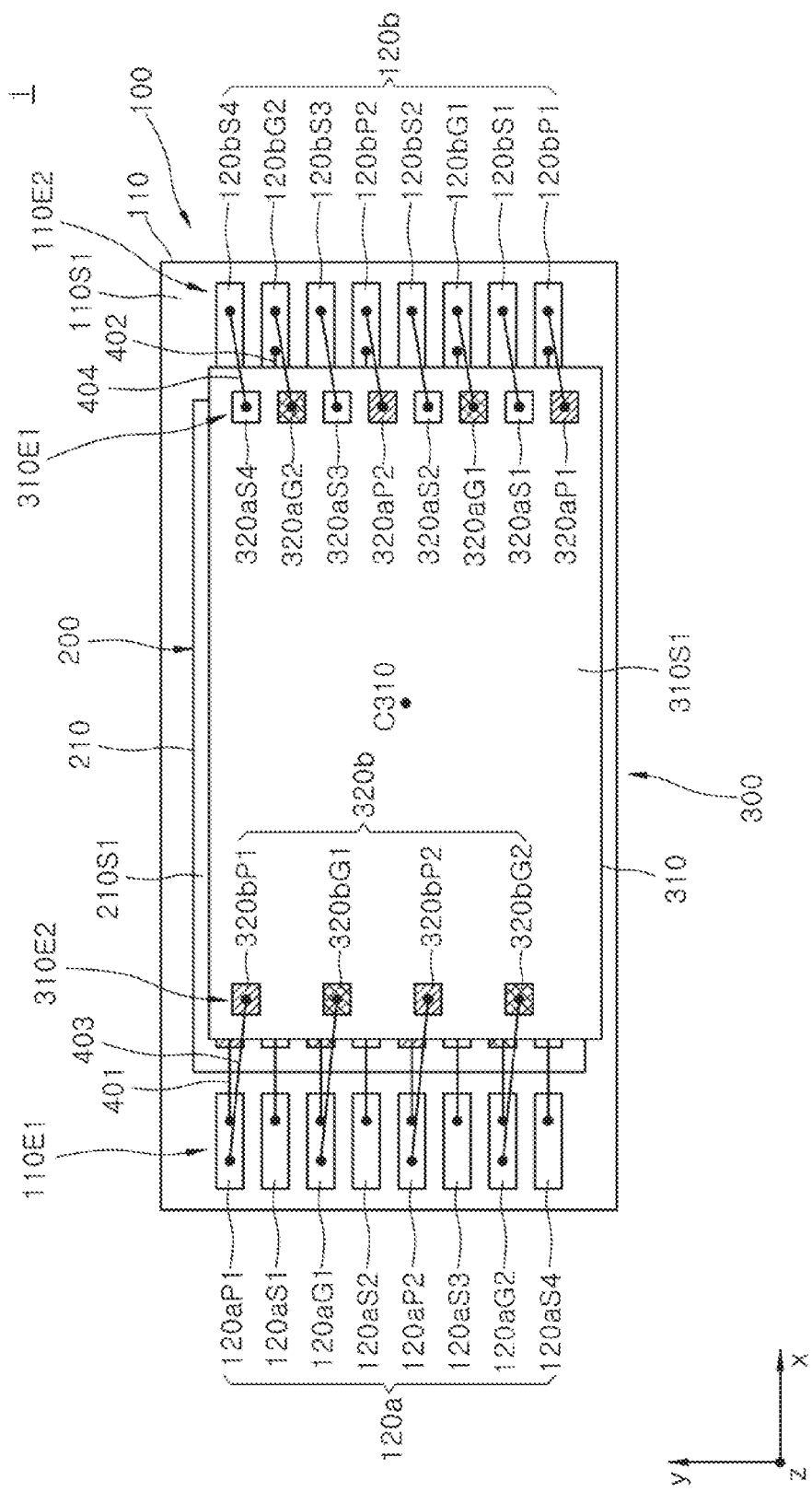

SEMICONDUCTOR PACKAGE INCLUDING SEMICONDUCTOR CHIP HAVING POINT SYMMETRIC CHIP PADS

CROSS-REFERENCE TO RELATED APPLICATIONS

The present application claims priority under 35 U.S.C. 119(a) to Korean Application No. 10-2020-0017892, filed on Feb. 13, 2020, which is incorporated herein by references in its entirety.

BACKGROUND

1. Technical Field

The present disclosure generally relates to a semiconductor package and, more particularly, to a semiconductor chip having a chip pad of a point-symmetric structure and a semiconductor package including the same.

2. Related Art

The semiconductor industry has evolved to manufacture semiconductor products having light weight, small size, high speed, multi-functionality, high performance, and high reliability at low cost, and one of the important technologies to achieve this is semiconductor package technology. Semiconductor package technology is a technology of mounting a semiconductor chip having a circuit portion formed through a wafer process on a package substrate, a technology of securing an electrical connection between the semiconductor chip and an external electronic device through the package substrate, and a technology of protecting the semiconductor chip from an external environment.

Due to package products becoming lighter and shorter, studies are being conducted on connection pads for electrically connecting semiconductor chips to package substrates. The studies on the connection pads include studies on the design of package substrates and the pads disposed on the semiconductor chips.

SUMMARY

A semiconductor package according to an aspect of the present disclosure may include a package substrate and a plurality of semiconductor chips stacked on the package substrate. Each of the semiconductor chips may include a chip body, at least one first side power pad and at least one first side ground pad that are disposed at a first side portion on one surface of the chip body, and at least one second side power pad and at least one second side ground pad that are disposed at a second side portion opposite to the first side portion on the one surface of the chip body. One of the at least one second side power pad may be disposed point-symmetrically to a corresponding one of the at least one first side power pad with respect to a reference point on the one surface of the chip body, and one of the at least one second side ground pad may be disposed point-symmetrically to a corresponding one of the at least one first side ground pad with respect to the reference point on the one surface of the chip body.

A semiconductor package according to another aspect of the present disclosure may include a package substrate, and a plurality of semiconductor chips stacked on the package substrate. Each of the semiconductor chips may include a chip body, at least one first side power pad, at least one first side ground pad, and at least one signal pad that are disposed at a first side portion on one surface of the chip body, and at least one second side power pad and at least one second side ground pad that are disposed at a second side portion opposite to the first side portion on the one surface of the chip body. One of the at least one second side power pad may be disposed point-symmetrically to a corresponding one of the at least one first side power pad with respect to a reference point on the one surface of the chip body, and one of the at least one second side ground pad may be disposed point-symmetrically to a corresponding one of the at least one first side ground pad with respect to the reference point on the one surface of the chip body.

A semiconductor package according to another aspect of the present disclosure may include a package substrate including a first bond finger array and a second bond finger array that are spaced apart from each other and arranged in a line, respectively. In addition, the semiconductor package may include a lower semiconductor chip disposed between the first and second bond finger arrays, and an upper semiconductor chip disposed on the lower semiconductor chip. The lower semiconductor chip and the upper semiconductor chip have substantially the same pad arrangement with each other. Each of the semiconductor chips may include a chip body, at least one first side power pad, at least one first side ground pad, and at least one signal pad that are disposed at a first side portion on one surface of the chip body, and at least one second side power pad and at least one second side ground pad that are disposed at a second side portion opposite to the first side portion on the one surface of the chip body. One of the at least one second side power pad may be disposed point-symmetrically to a corresponding one of the at least one first side power pad with respect to a reference point on the one surface of the chip body, and one of the at least one second side ground pad may be disposed point-symmetrically to a corresponding one of the at least one first side ground pad with respect to the reference point on the one surface of the chip body. The at least one first side power pad of the lower semiconductor chip and the at least one second side power pad of the upper semiconductor chip may be disposed to overlap each other, and the at least one first side ground pad of the lower semiconductor chip and the at least one second side ground pad of the upper semiconductor chip may be disposed to overlap each other.

BRIEF DESCRIPTION OF THE DRAWINGS

FIGS. 5 and 6 are views schematically illustrating electrical connections between a package substrate and a semiconductor chip according to embodiments of the present disclosure.

DETAILED DESCRIPTION

Figure 1:
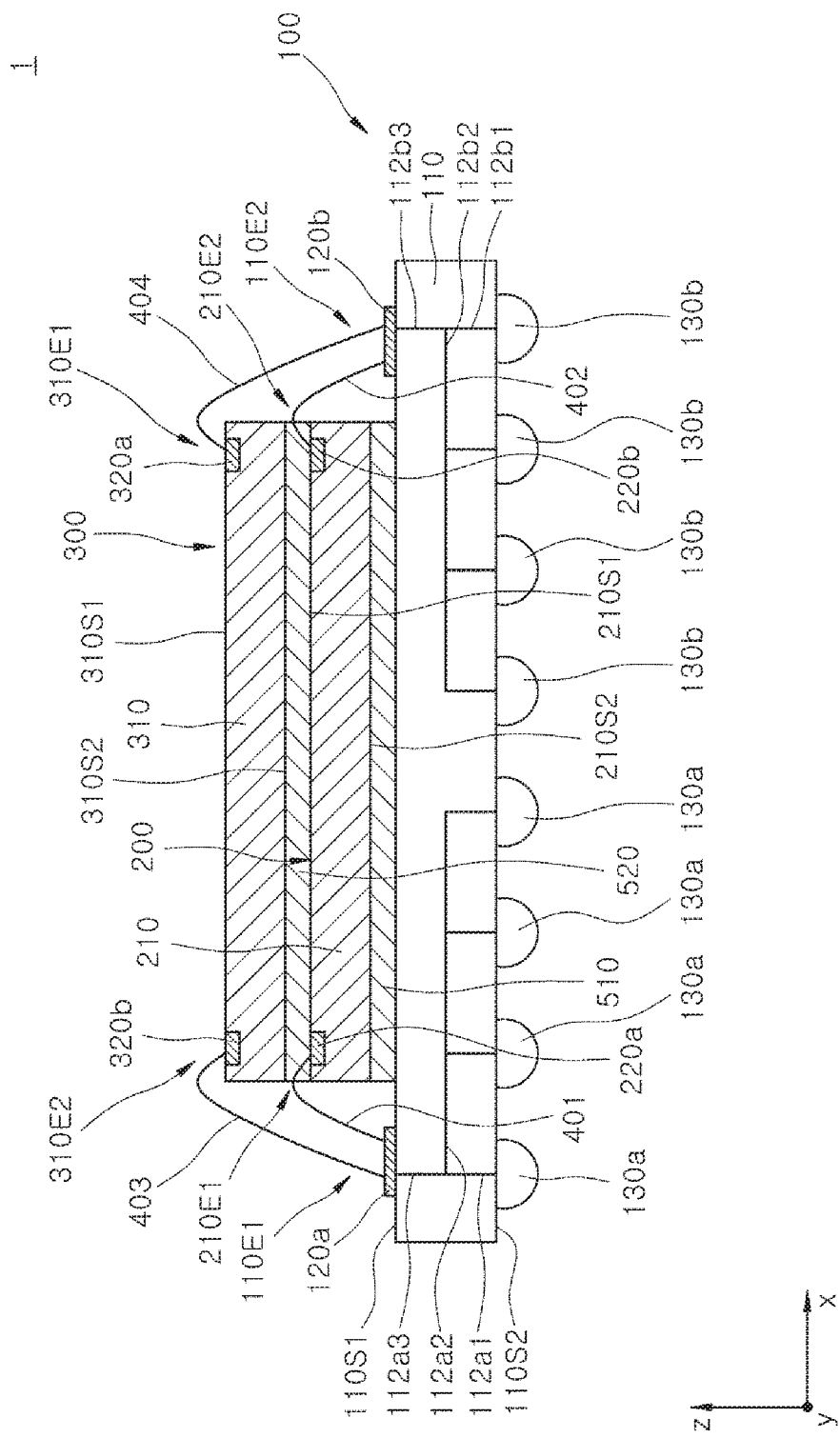
FIG. 1 is a cross-sectional view schematically illustrating a semiconductor package according to an embodiment of the present disclosure.

The terms used herein may correspond to words selected in consideration of their functions in presented embodiments, and the meanings of the terms may be construed to be different according to one of ordinary skill in the art to which the embodiments belong. If defined in detail, the terms may be construed according to the definitions. Unless otherwise defined, the terms (including technical and scientific terms) used herein have the same meaning as commonly understood by one of ordinary skill in the art to which associated embodiments belong. In the description of the present disclosure, words such as "first" and "second" and "upper" and "lower" are for distinguishing members, and are not used to limit the members themselves by implying a specific number or order of elements.

Same reference numerals refer to same elements throughout the specification. Even though a reference numeral is not indicated or described with reference to a drawing, the reference numeral may be indicated or described with reference to another drawing. In addition, even though a reference numeral is not shown in a drawing, it may be indicated or described with reference to another drawing.

In the specification of the present disclosure, a semiconductor package is illustrated using the orthogonal axes x-y-z of a right-handed Cartesian coordinate system. In this case, the x-direction may mean a direction parallel to the x-axis. Likewise, the y-direction and z-direction may mean directions parallel to the y-axis and the z-axis, respectively.

FIG. 1 is a cross-sectional view schematically illustrating a semiconductor package according to an embodiment of the present disclosure. Referring to FIG. 1, the semiconductor package 1 may include a package substrate 100 and a plurality of semiconductor chips 200 and 300 stacked on the package substrate 100. The plurality of semiconductor chips 200 and 300 may have substantially the same pad arrangement. As an example, the arrangement of power pads, ground pads, and signal pads of the plurality of semiconductor chips 200 and 300 may be substantially the same. In an embodiment, the plurality of semiconductor chips 200 and 300 may be chips of the same type. The package substrate 100 and the semiconductor chips 200 and 300 may be electrically connected by bonding wires 401, 402, 403, and 404.

The package substrate 100 may have a substrate body 110. The substrate body 110 may have a first surface 110S1 and a second surface 110S2 opposite to the first surface 110S1.

First and second bond finger arrays 120a and 120b may be disposed on the first surface 110S1 of the substrate body 110. The first and second bond finger arrays 120a and 120b may each include a plurality of bond fingers (not illustrated) for wire-bonding with the semiconductor chips 200 and 300. The plurality of bond fingers may include power fingers, ground fingers, and signal fingers. The first bond finger array 120a may be disposed on a first side portion 110E1 of the substrate body 110. The second bond finger array 120b may be disposed on a second side portion 110E2 of the substrate body 110. The arrangement of the plurality of bond fingers of the first and second bond finer arrays 120a and 120b will be described below using a plan view of FIG. 2.

First and second connection structures 130a and 130b may be disposed on the second surface 110S2 of the substrate body 110. The first and second connection structures 130a and 130b may be connected to an external printed circuit board or an external electronic system. Through the first and second connection structures 130a and 130b, the package substrate 100 may be supplied with power from the external printed circuit board or electronic system or exchange electrical signals with each other. In FIG. 1, the number of the first and second connection structures 130a and 130b is shown as four, respectively, but is not limited thereto, and various other modifications are possible.

The first and second connection structures 130a and 130b may receive electric signals that are distinguished from each other from the external printed circuit board or the electronic system. That is, the electric signal received through any one of the first connection structures 130a may be transmitted to the corresponding one of the signal fingers of the first bond finger array 120a through first internal wirings 112a1, 112a2, and 112a3. In addition, the electric signal received through any one of the second connection structures 130b may be transmitted to the corresponding one of the signal fingers of the second bond finger array 120b through second internal wirings 112b1, 112b2, and 112b3. That is, an electrical signal path from the first connection structures 130a to the signal fingers of the first bond finger array 120a and an electrical signal path from the second connection structures 130b to the signal fingers of the second bond finger array 120b may be independent of each other. The first and second internal wirings 112a1, 112a2, 112a3, 112b1, 112b2, and 112b3 may include first blind vias 112a1 and 112b1, internal circuit layers 112a2 and 112b2, and second blind vias 112a3 and 112b3.

Referring to FIG. 1, the plurality of semiconductor chips 200 and 300, with the lower semiconductor chip 200 disposed on the package substrate 110 and the upper semiconductor chip 300 disposed on the lower semiconductor chip 200, are disclosed. The package substrate 110 and the lower semiconductor chip 200 may be bonded by a first adhesive layer 510. The lower semiconductor chip 200 and the upper semiconductor chip 300 may be bonded by a second adhesive layer 520. The first and second adhesive layers 510 and 520 may each, for example, include a non-conductive paste or a non-conductive film.

The lower semiconductor chip 200 may have a chip body 210. The chip body 210 may have a first surface 210S1 and a second surface 210S2 opposite to the first surface 210S1. First and second chip pads 220a and 220b may be disposed on the first surface 210S1 of the chip body 210. The first and second chip pads 220a and 220b may function as connection pads for wire bonding with the package substrate 100. The first chip pad 220a may be disposed on a first side portion 210E1 of the chip body 210. The second chip pad 220b may be disposed on a second side portion 210E2 of the chip body 210. In an embodiment, the first chip pad 220a and the second chip pad 220b may each, for example, include a power pad and a ground pad. In addition, any one of the first chip pad 220a and the second chip pad 220b may further include a signal pad. As an example, as illustrated in a plan view of FIG. 3, the first chip pad 220a may have a power pad, a ground pad, and a signal pad, and the second chip pad 220b may have a power pad and a ground pad. The pad arrangement of the first and second chip pads 220a and 220b will be described below in detail using the plan view of FIG. 3.

Meanwhile, the first and second chip pads 220a and 220b may be connected to corresponding fingers of the first and second bond finger arrays 120a and 120b by first and second bonding wires 401 and 402, respectively.

Referring to FIG. 1, the upper semiconductor chip 300 may be stacked on the lower semiconductor chip 200. The upper semiconductor chip 300 and the lower semiconductor chip 200 may have substantially the same pad arrangement. As an example, the arrangement of the power pads, ground pads, and signal pads of the upper semiconductor chip 300 and the lower semiconductor chip 200 may be substantially the same as each other. In an embodiment, the upper semiconductor chip 300 may be the same type of chip as the lower semiconductor chip 200. As an example, the configuration of the upper semiconductor chip 300 may be substantially the same as that of the lower semiconductor chip 200. In an embodiment, the upper semiconductor chip 300 may be disposed to overlap the lower semiconductor chip 200. At this time, the first side portion 310E1 of the upper semiconductor chip 300 and the second side portion 210E2 of the lower semiconductor chip 200 may overlap, and the second side portion 310E2 of the upper semiconductor chip 300 and the first side portion 210E1 of the lower semiconductor chip 200 may overlap. In other words, as described later in connection with FIG. 6, when the upper semiconductor chip 300 is staked on the lower semiconductor chip 200, the upper semiconductor chip 300 may be stacked while being rotated 180° relative to the center point C200 of the lower semiconductor chip 200.

The upper semiconductor chip 300 may have a chip body 310. The chip body 310 may have a first surface 310S1 and a second surface 310S1 opposite to the first surface 310S1, First and second chip pads 320a and 320b may be disposed on the first surface 310S1 of the chip body 310. The first and second chip pads 320a and 320b may function as connection pads for wire bonding with the package substrate 100. The first chip pad 320a may be disposed on a first side portion 310E1 of the chip body 310. The second chip pad 320b may be disposed on a second side portion 310E2. In an embodiment, the first chip pad 320a and the second chip pad 320b may each include, for example, power pads and ground pads. In addition, any one of the first chip pad 320a and the second chip pad 320b may further include signal pads. As an example, as illustrated in a plan view of FIG. 4, the first chip pad 320a may have a power pad, a ground pad, and a signal pad, and the second chip pad 320b may have power pads and ground pads. The pad arrangement of the first and second chip pads 320a and 320b will be described below in detail using the plan view of FIG. 4.

The first chip pad 320a may be connected to a corresponding finger in the second bond finger array 120b by a fourth bonding wire 404. Similarly, the second chip pad 320b may be connected to a corresponding finger in the first bonding finger array 120a by a third bonding wire 403.

Figure 2:
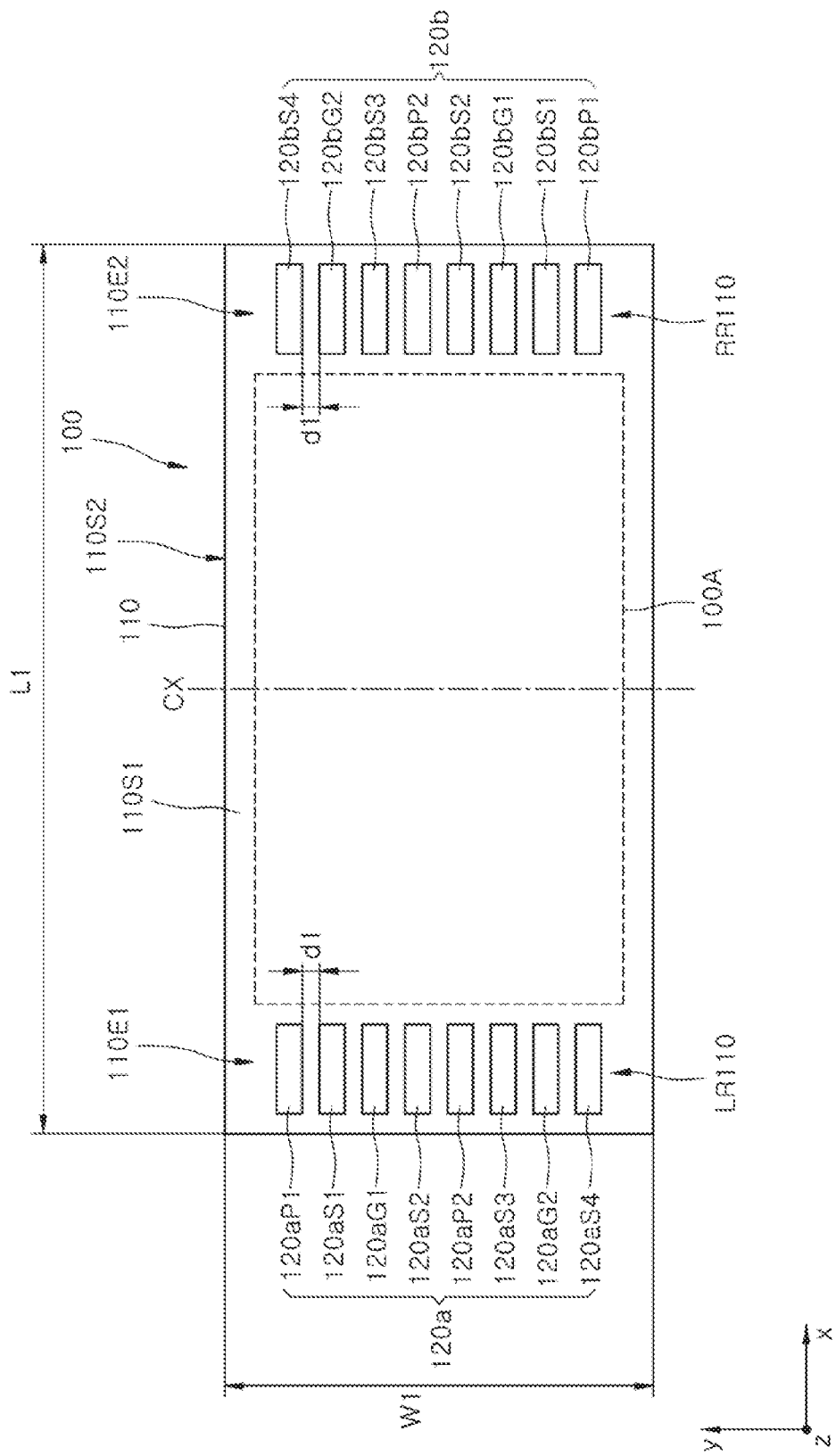
FIG. 2 is a plan view schematically illustrating a package substrate according to an embodiment of the present disclosure.

FIG. 2 is a plan view schematically illustrating a package substrate according to an embodiment of the present disclosure. The package substrate 100 of FIG. 2 may be the package substrate 100 of the semiconductor package 1 of FIG. 1. Referring to FIGS. 1 and 2, the package substrate 100 may include a substrate body 110 having a first surface 110S1 and a second surface 110S2 opposite to the first surface 110S1. The substrate body 110 may have a length Li along the x-direction and a width W1 along the y-direction. In addition, the package substrate 100 may have a central axis CX extending in the y-direction at ½ of the length Li.

First and second bond finger arrays 120a and 120b may be disposed on the first surface 110S1 of the substrate body 110. The first bond finger array 120a may be disposed on a first side portion 110E1 of the substrate body 110, and the second bond finger array 120b may be disposed on a second side portion 110E2 of the substrate body 110. The first and second side portions 110E1 and 110E2 may be located outside a semiconductor chip mounting area 100A in which the lower semiconductor chip 200 is disposed. The first and second side portions 110E1 and 110E2 may be located opposite to each other on the basis of the semiconductor chip mounting area 100A. As described below in connection with FIGS. 3 and 5, the first side portion 110E1 of the substrate body 110 may be disposed adjacent to the first side portion 210E1 of the lower semiconductor chip 200, and the second side portion 110E2 of the substrate body 110 may be disposed adjacent to the second side portion 210E2 of the lower semiconductor chip 200.

In an embodiment, the first bond finger array 120a may include two power fingers 120aP1 and 120aP2, two ground fingers 120aG1 and 120aG2, and four signal fingers 120aS1, 120aS2, 120aS3, and 120aS4. The power fingers 120aP1 and 120aP2, the ground fingers 120aG1 and 120aG2, and the signal fingers 120aS1, 120aS2, 120aS3, and 120aS4 may be aligned in a line LR110 along one direction (i.e., the y-direction) at the first side portion 110E1. When the power fingers 120aP1 and 120aP2, the ground fingers 120aG1 and 120aG2, and the signal fingers 120aS1, 120aS2, 120aS3, and 120aS4 are aligned in a line LR110, the fingers adjacent to each other may be spaced apart from each other at a predetermined distance d1 with respect to the y-direction.

As a specific example, the first bond finger array 120a may include a first side first power finger 120aP1, a first side first signal finger 120aS1, a first side first ground finger 120aG1, a first side second signal finger 120aS2, a first side second power finger 120aP2, a first side third signal finger 120aS3, a first side second ground finger 120aG2, and a first side fourth signal finger 120aS4 which are sequentially disposed along the y-direction.

Meanwhile, the number of the power fingers, the number of the ground fingers, and the number of the signal fingers of the first bond finger array 120a may not necessarily be limited to the number described above. In an embodiment, the number of the power fingers, the number of the ground fingers, and the number of the signal fingers of the first bond finger array 120a may be determined in correspondence with the number of power pads, the number of ground pads, and the number of signal pads disposed on the lower and upper semiconductor chips 200 and 300, as described below with reference to FIGS. 3 and 4.

In addition, the arrangement order of the power fingers, the ground fingers, and the signal fingers of the first bond finger array 120a may not necessarily be limited to the above-described order. The arrangement order of the power fingers, the ground fingers, and the signal fingers of the first bond finger array 120a may be determined in correspondence with the arrangement order of the power pads, the ground pads, and the signal pads disposed on the lower and upper semiconductor chips 200 and 300, as described below with reference to FIGS. 3 to 6.

Meanwhile, the second bond finger array 120b may include two power fingers 120bP1 and 120bP2, two ground fingers 120bG1 and 120bG2, and four signal fingers 120bS1, 120bS2, 120bS3, and 120bS4. The power fingers 120bP1 and 120bP2, the ground fingers 120bG1 and 120bG2, and the signal fingers 120bS1, 120bS2, 120bS3, and 120bS4 may be aligned in a line RR110 along one direction (i.e., the y-direction) at the second side portion 110E2. When the power fingers 120bP1 and 120bP2, the ground fingers 120bG1 and 120bG2, and the signal fingers 120bS1, 120bS2, 120bS3 and 120bS4 are aligned in a line RR110, the fingers adjacent to each other may be spaced apart from each other at a predetermined distance d1 with respect to the y-direction.

As a specific example, the second bond finger array 120b may include a second side fourth signal finger 120bS4, a second side second ground finger 120bG2, a second side third signal finger 120bS3, a second side second power finger 120bP2, a second side second signal finger 120bS2, a second side first ground finger 120bG1, a second side first signal finger 120bS1, and a second side first power finger 120bP1 which are sequentially disposed along the y-direction.

Meanwhile, the number of the power fingers, the number of the ground fingers, and the number of the signal fingers of the second bond finger array 120b may not necessarily be limited to the number described above. In an embodiment, the number of the power fingers, the number of the ground fingers, and the number of the signal fingers of the second bond finger array 120b may be determined in correspondence with the number of power pads, the number of ground pads, and the number of signal pads disposed on the lower and upper semiconductor chips 200 and 300, as described below with reference to FIGS. 3 and 4.

In addition, the arrangement order of the power fingers, the ground fingers, and the signal fingers of the second bond finger array 120b may not necessarily be limited to the above-described order. The arrangement order of the power fingers, the ground fingers, and the signal fingers of the second bond finger array 120b may be determined in correspondence with the arrangement order of the power pads, the ground pads, and the signal pads disposed on the lower and upper semiconductor chips 200 and 300, as described below with reference to FIGS. 3 to 6.

In an embodiment, the positions of the pads of the first bond finger array 120a aligned in the y-direction and the positions of the pads of the second bond finger array 120b aligned in the y-direction may be symmetrical to each other with respect to the central axis CX.

In an embodiment, the signal fingers 120aS1, 120aS2, 120aS3, and 120aS4 of the first bond finger array 120a may be electrically separated from the signal fingers 120bS1, 120bS2, 120bS3, and 120bS4 of the second bond finger array 120b. In other words, the signal fingers 120aS1, 120aS2, 120aS3, and 120aS4 of the first bond finger array 120a and the signal fingers 120bS1, 120bS2, 120bS3, and 120bS4 of the second bond finger array 120b may constitute independent signal paths that are distinguished from each other. In an embodiment, referring back to FIG. 1, the signal fingers 120aS1, 120aS2, 120aS3, and 120aS4 of the first bond finger array 120a may be connected to the first connection structures 130a through the first internal wirings 112a1, 112a2, and 112a3. The signal fingers 120bS1, 120bS2, 120bS3, and 120bS4 of the second bond finger array 120b may be connected to the second connection structures 130b through the second internal wirings 112b1, 112b2, and 112b3.

As described later with reference to FIGS. 5 and 6, the signal fingers 120aS1, 120aS2, 120aS3, and 120aS4 of the first bond finger array 120a may be connected to the signal pads 220aS1, 220aS2, 220aS3, and 220aS4 of the lower semiconductor chip 200. On the other hand, the signal fingers 120bS1, 120bS2, 120bS3, and 120bS4 of the second bond finger array 120b may be connected to the signal pads 320aS1, 320aS2, 320aS3, and 320aS4 of the upper semiconductor chip 300. That is, data signal and address command signal for the lower semiconductor chip 200 can be transmitted through the signal fingers 120aS1, 120aS2, 120aS3, and 120aS4 of the first bond finger array 120a. In addition, data signal and address command signal for the upper semiconductor chip 300 can be transmitted through the signal fingers 120bS1, 120bS2, 120bS3, and 120bS4 of the second bond finger array 120b. As a result, each of the lower semiconductor chip 200 and the upper semiconductor chip 300 can exchange electric signals with the package substrate 100 by an independent signal path, respectively.

On the other hand, the power fingers 120aP1 and 120aP2 and the ground fingers 120aG1 and 120aG2 of the first bond finger array 120a and the power fingers 120bP1 and 120bP2 and the ground fingers 120bG1 and 120bG2 of the second bond finger array 120b may be shared by the lower semiconductor chip 200 and the upper semiconductor chip 300, as described below in connection with FIG. 6.

Figure 3:
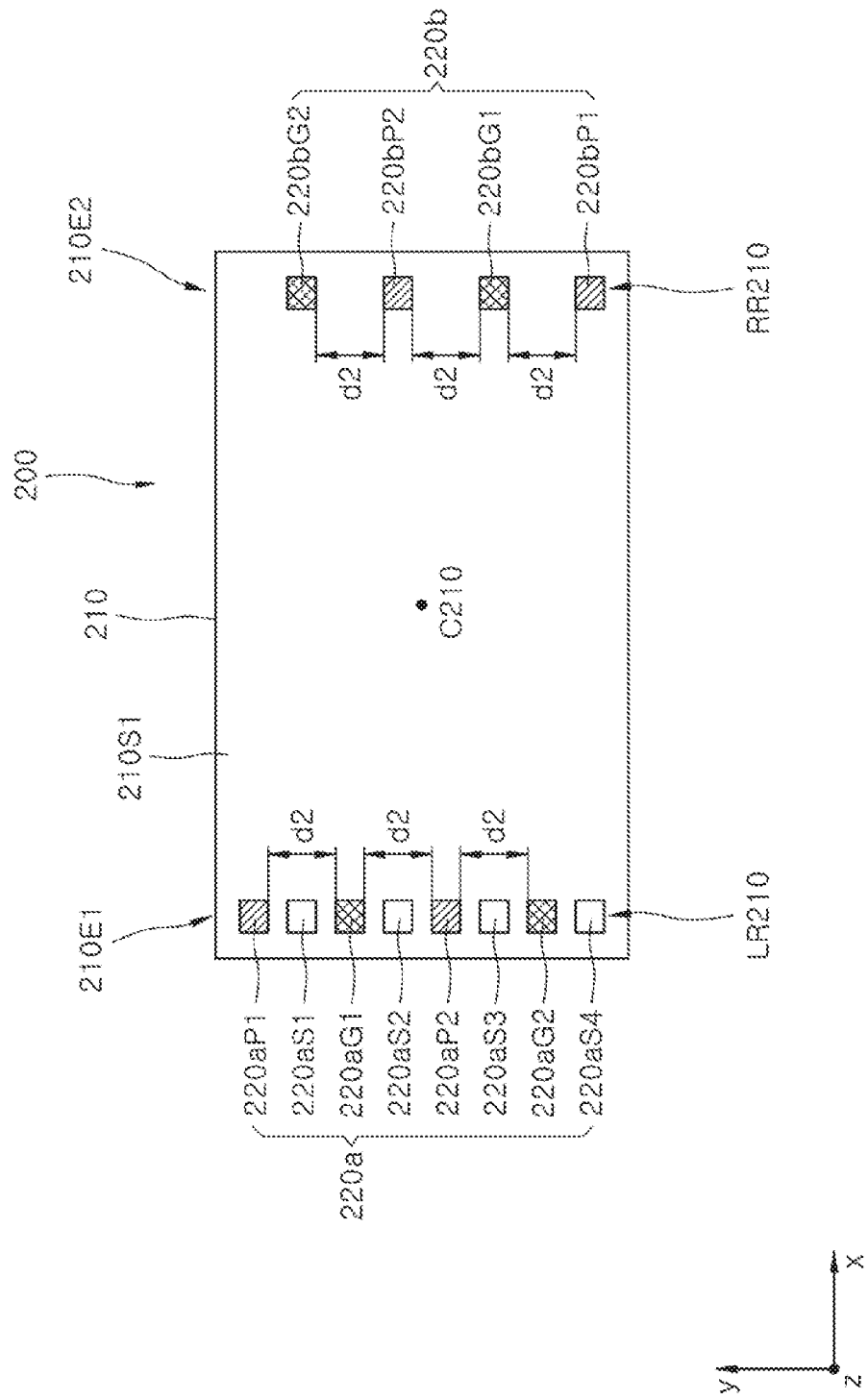
FIG. 3 is view schematically illustrating a first semiconductor chip according to an embodiment of the present disclosure.

FIG. 3 is view schematically illustrating a first semiconductor chip according to an embodiment of the present disclosure. Referring to FIG. 3, the first semiconductor chip 200 may be the lower semiconductor chip 200 described above with reference to FIG. 1.

Referring to FIGS. 1 and 3, the first semiconductor chip 200 may include a chip body 210, a first chip pad 220a disposed at a first side portion 210E1 on a first surface 210S1 of the chip body 210, and a second chip pad 220b disposed at a second side portion 210E2 on the first surface 210S1 of the chip body 210.

In an embodiment, the first chip pad 220a may include two power pads 220aP1 and 220aP2, two ground pads 220aG1 and 220aG2, and four signal pads 220aS1, 220aS2, 220aS3, and 220aS4. The power pads 220aP1 and 220aP2, the ground pads 220aG1 and 220aG2, and the signal pads 220aS1, 220aS2, 220aS3, and 220aS4 may be aligned in a line LR210 along one direction (i.e., the y-direction) at the first side portion 210E1.

As a specific example, the first chip pad 220a may include a first side first power pad 220aP1, a first side first signal pad 220aS1, a first side first ground pad 220aG1, a first side second signal pad 220aS2, a first side second power pad 220aP2, a first side third signal pad 220aS3, a first side second ground pad 220aG2, and a first side fourth signal pad 220aS4 which are sequentially disposed along the y-direction.

Meanwhile, the number of the first side power pads, the number of the first side ground pads, and the number of the first side signal pads of the first chip pad 220a may not necessarily be limited to the number described above. In addition, the arrangement order of the first side power pads, the number of the first side ground pads, and the number of the first side signal pads of the first chip pad 220a may not necessarily be limited to the above-described order and various modifications are possible.

In an embodiment, the second chip pad 220b may include two power pads 220bP1 and 220bP2, and two ground pads 220bG1 and 220bG2. The power pads 220bP1 and 220bP2 and the ground pads 220bG1 and 220bG2 may be aligned in a line RR210 along one direction (i.e., the y-direction) at the second side portion 210E2.

As a specific example, the second chip pad 220b may include a second side second ground pad 220bG2, a second side second power pad 220bP2, a second side first ground pad 220bG1, and a second side first power pad 220bP1 which are sequentially disposed along the y-direction. Meanwhile, the number of the second side power pads and the number of the second side ground pads of the second chip pad 220b may be substantially the same as the number of the first side power pads and the number of the first side ground pads of the first chip pad 220a. In addition, the second side power pads and the second side ground pads may be arranged to correspond to the first side power pads and the first side ground pads of the first chip pad 220a. When compared to the first chip pad 220a, the second chip pad 220b may not include a signal pad.

In an embodiment, any one of the second side power pads 220bP1 and 220bP2 may be disposed point-symmetrically to the corresponding one of the first side power pads 220aP1 and 220aP2 with respect to a reference point C210 on the first surface 210S1. Any one of the second side ground pads 220bG1 and 220bG2 may be disposed point-symmetrically to the corresponding one of the first side ground pads 220aG1 and 220aG2 with respect to the reference point C210 on the first surface 210S1. Here, the reference point C210 on the first surface 210S1 may be the center point of a shape of the chip body 210 that is projected onto the first surface 210S1. As an example, when the chip body 210 has a rectangular shape on the first surface 210S1, the center point may be an intersection of two diagonal lines connecting the vertices facing each other in the rectangle.

As a specific example, the first side first power pad 220aP1 and the second side first power pad 220bP1 may be disposed point-symmetrically to each other with respect to the reference point C210. The first side second power pad 220aP2 and the second side second power pad 220bP2 may be disposed point-symmetrically to each other with respect to the reference point C210. The first side first ground pad 220aG1 and the second side first ground pad 220bG1 may be disposed point-symmetrically to each other with respect to the reference point C210. The first side second ground pad 220aG2 and the second side second ground pad 220bG2 may be disposed point-symmetrically to each other with respect to the reference point C210.

In an embodiment, the first side first power pad 220aP1 and the second side first power pad 220bP1 may have the same shape. The first side second power pad 220aP2 and the second side second power pad 220bP2 have the same shape. The first side first ground pad 220aG1 and the second side first ground pad 220bG1 may have the same shape. The first side second ground pad 220aG2 and the second side second ground pad 220bG2 may have the same shape.

In an embodiment, when the first side first and second power pads 220aP1 and 220aP2, the first side first and second ground pads 220aG1 and 220aG2, and the first side first to fourth signal pads 220aS1, 220aS2, 220aS3, and 220aS4 are aligned in a line LR210 to have the arrangement order of FIG. 3, the power pads and ground pads adjacent to each other may be spaced apart from each other at a predetermined distance d2 in the y-direction. When the second side first and second power pads 220bP1 and 220bP2, and the second side first and second ground pads 220bG1 and 220bG2 are aligned in a line RR210 to have the arrangement order of FIG. 3, the power pads and ground pads adjacent to each other may be spaced apart from each other at the predetermined distance d2 in the y-direction.

Figure 4:
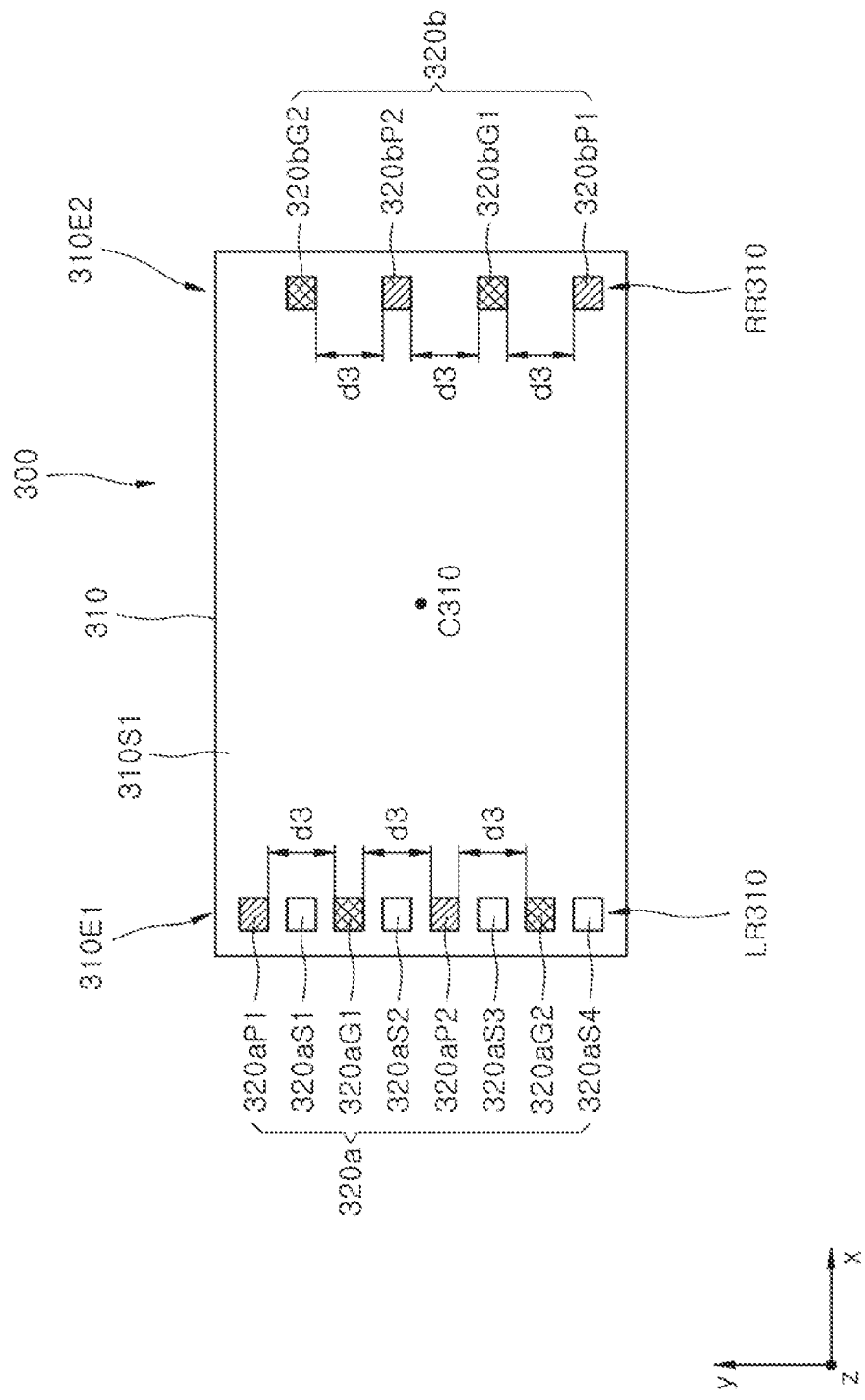
FIG. 4 is view schematically illustrating a second semiconductor chip according to an embodiment of the present disclosure.

FIG. 4 is view schematically illustrating a second semiconductor chip according to an embodiment of the present disclosure. Referring to FIG. 4, the second semiconductor chip 300 may be the upper semiconductor chip 300 of the semiconductor package 1 described above in connection with FIG. 1. The second semiconductor chip 300 of FIG. 4 may have substantially the same pad arrangement as the first semiconductor chip 200 of FIG. 3. That is, the arrangement of the power pads, ground pads, and signal pads of the second semiconductor chip 300 may be substantially the same as that of the first semiconductor chip 200. In an embodiment, the second semiconductor chip 300 may be the same type of chip as the first semiconductor chip 200. The configuration of the second semiconductor chip 300 may be substantially the same as that of the first semiconductor chip 200.

The second semiconductor chip 300 may include a chip body 310, a first chip pad 320a disposed at a first side portion 310E1 on a first surface 310S1 of the chip body 310, and a second chip pad 320b disposed at a second side portion 310E2 on the first surface 310S1 of the chip body 310.

In an embodiment, the first chip pad 320a may include first side first and second power pads 320aP1 and 320aP2, first side first and second ground pads 320aG1 and 320aG2, and first side first to fourth signal pads 320aS1, 320aS2, 320aS3, and 320aS4. The first side first and second power pads 320aP1 and 320aP2, the first side first and second ground pads 320aG1 and 320aG2, and the first side first to fourth signal pads 320aS1, 320aS2, 320aS3, and 320aS4 may be aligned in a line LR310 along one direction (i.e., the y-direction) at the first side portion 310E1.

In an embodiment, the second chip pad 320b may include second side first and second power pads 320bP1 and 320bP2, and second side first and second ground pads 320bG1 and 320bG2. The second side first and second power pads 320bP1 and 320bP2 and the second side first and second ground pads 320bG1 and 320bG2 may be aligned in a line RR310 along one direction (i.e., the y-direction) at the second side portion 310E2. When compared to the first chip pad 320a, the second chip pad 320b may not have the signal pads.

In an embodiment, any one of the second side power pads 320bP1 and 320bP2 may be disposed point-symmetrically to the corresponding one of the first side power pads 320aP1 and 320aP2 with respect to a reference point C310 on the first surface 310S1. Any one of the second side ground pads 320bG1 and 320bG2 may be disposed point-symmetrically to the corresponding one of the first side ground pads 320aG1 and 320aG2 with respect to the reference point C310 on the first surface 310S1. Here, the reference point C310 on the first surface 310S1 may be the center point of a shape of the chip body 310 that is projected onto the first surface 310S1. As an example, when the chip body 310 has a rectangular shape on the first surface 310S1, the center point may be an intersection of two diagonal lines connecting the vertices facing each other in the rectangle.

As a specific example, the first side first power pad 320aP1 and the second side first power pad 320bP1 may be disposed point-symmetrically to each other with respect to the reference point C310. The first side second power pad 320aP2 and the second side second power pad 320bP2 may be disposed point-symmetrically to each other with respect to the reference point C310. The first side first ground pad 320aG1 and the second side first ground pad 320bG1 may be disposed point-symmetrically to each other with respect to the reference point C310. The first side second ground pad 320aG2 and the second side second ground pad 320bG2 may be disposed point-symmetrically to each other with respect to the reference point C310.

In an embodiment, when the first side first and second power pads 320aP1 and 320aP2, the first side first and second ground pads 320aG1 and 320aG2, and the first side first to fourth signal pads 320aS1, 320aS2, 320aS3, and 320aS4 are aligned in a line LR310 to have the arrangement order of FIG. 4, the power pads and ground pads adjacent to each other may be spaced apart from each other at a predetermined distance d3 in the y-direction. When the second side first and second power pads 320bP1 and 320bP2 and the second side first and second ground pads 320bG1 and 320bG2 are aligned in a line RR310 to have the arrangement order of FIG. 4, the power pads and ground pads adjacent to each other may be spaced apart from each other at the predetermined distance d3 in the y-direction.

FIGS. 5 and 6 are views schematically illustrating electrical connections between a package substrate and a semiconductor chip according to an embodiment of the present disclosure. FIG. 5 is a view for explaining a form in which a lower semiconductor chip 200 is mounted on the package substrate 100 in the semiconductor package 1 described above with reference to FIG. 1. Here, the lower semiconductor chip 200 may have the same configuration as the first semiconductor chip 200 described above in connection with FIG. 3. FIG. 6 is a view for explaining a form in which an upper semiconductor chip 300 is stacked on the lower semiconductor chip 200 in the semiconductor package 1 described above with reference to FIG. 1. Here, the upper semiconductor chip 300 may have the same configuration as the second semiconductor chip 300 described above in connection with FIG. 4.

Referring to FIG. 5, the lower semiconductor chip 200 may be disposed in a semiconductor chip mounting area 110A of a substrate body 110. The lower semiconductor chip 200 may be bonded to the substrate body 110 by the first adhesive layer 510 described above with reference to FIG. 1. The pads of a first chip pad 220a on the lower semiconductor chip 200 may be wire-bonded to corresponding fingers of a first bond finger array 120a on the package substrate 100, respectively. As a specific example, for the lower semiconductor chip 200, the power pads 220aP1 and 220aP2, the ground pads 220aG1 and 220aG2, and the signal pads 220aS1, 220aS2, 220aS3, and 220aS4 of the first chip pad 220a may be connected to the corresponding power fingers 120aP1 and 120aP2, the ground fingers 120aG1 and 120aG2, and the signal fingers 120aS1, 120aS2, 120aS3, and 120aS4 of the first bond finger array 120a, respectively. As illustrated in FIG. 5, the pads of the first chip pad 220a may be wire-bonded in a one-to-one (1:1) ratio with the fingers of the first bond finger array 120a. Further, the pads of the first chip pad 220a may be disposed adjacent to the wire-bonded fingers of the first bond finger array 120a along the x-direction.

In addition, the pads of the second chip pad 220b on the lower semiconductor chip 200 may be wire-bonded to the corresponding fingers of the second bond finger array 120b on the package substrate 100. Specifically, the power pads 220bP1 and 220bP2 and the ground pads 220bG1 and 220bG2 of the second chip pad 220b may be connected to the corresponding power fingers 120bP1 and 120bP2, and the ground fingers 120bG1 and 120bG2 of the second bond finger array 120b, respectively. As illustrated in FIG. 5, the pads of the second chip pad 220b may be wire-bonded in a 1:1 ratio with the fingers of the second bond finger array 120b. Further, the pads of the second chip pad 220b may be disposed adjacent to the wire-bonded fingers of the second bond finger array 120b along the x-direction. However, pads connected to the signal fingers 120bS1, 120bS2, 120bS3, and 120bS4 of the second bond finger array 120b might not exist among the pads of the second chip pad 220b because the second chip pad 220b does not have signal pads.

Referring to FIG. 6 together with FIG. 5, the upper semiconductor chip 300 may be stacked on the lower semiconductor chip 200. As described above with reference to FIG. 1, a second adhesive layer 520 may bond the lower semiconductor chip 200 and the upper semiconductor chip 300. In FIG. 6, for convenience of description, the upper semiconductor chip 300 is illustrated to be stacked by being offset at a predetermined distance from the lower semiconductor chip 200, but in practice, the upper semiconductor chip 300 may be disposed to overlap the lower semiconductor chip 200 without off-set. In an embodiment, the lower semiconductor chip 200 and the upper semiconductor chip 300 may have substantially the same pad arrangement. That is, the arrangements of the power pads, ground pads, and signal pads of the upper semiconductor chip 300 and the lower semiconductor chip 200 may be substantially the same. In an embodiment, the lower semiconductor chip 200 and the upper semiconductor chip 300 may be the same type of chips. The configuration of the lower semiconductor chip 200 and the configuration of the upper semiconductor chip 300 may be substantially the same.

When the upper semiconductor chip 300 is stacked on the lower semiconductor chip 200, the upper semiconductor chip 300 may be disposed to overlap the lower semiconductor chip 200, while being rotated 180° relative to the center point C310 with respect to the lower semiconductor chip 200. The lower and upper semiconductor chips 200 and 300 may have signal pads 220aS1, 220aS2, 220aS3, 220aS4, 320aS1, 320aS2, 320aS3, and 320aS4 only at the first sides 210E1 and 310E1 of the chip bodies 210 and 310 of the lower and upper semiconductor chips 200 and 300, respectively. Accordingly, by disposing the upper semiconductor chip 300 to overlap the lower semiconductor chip 200 after rotating the upper semiconductor chip 300 by 180° with respect to the lower semiconductor chip 200, the signal pads 220aS1, 220aS2, 220aS3, and 220aS4 of the lower semiconductor chip 200 can be connected to the signal fingers 120aS1, 120aS2, 120aS3, and 120aS4 of the first bond finger array 120a of the package substrate 100, and the signal pads 320aS1, 320aS2, 320aS3, and 320aS4 of the upper semiconductor chip 300 can be connected to the signal fingers 120bS1, 120bS2, 120bS3, and 120bS4 of the second bond finger array 120b. As described above, the signal fingers 120aS1, 120aS2, 120aS3, and 120aS4 of the first bond finger array 120a and the signal fingers 120bS1, 120bS2, 120bS3, and 120bS4 of the second bond finger array 120b may be connected to different signal paths of the package substrate 100, respectively. Accordingly, the lower semiconductor chip 200 and the upper semiconductor chip 300 may exchange data signals and address command signals via independent signal paths of the package substrate 100, respectively.

In addition, as described above, according to the embodiment of the present disclosure, the lower semiconductor chip 200 and the upper semiconductor chip 300 may have substantially the same pad arrangement. That is, the arrangements of the power pads, the ground pads, and the signal pads of the lower semiconductor chip 200 and the upper semiconductor chip 300 may be substantially the same. In an embodiment, the lower semiconductor chip 200 and the upper semiconductor chip 300 may be the same type of chips. Further, in each of the semiconductor chips, any one of the second side power pads may be disposed point-symmetrically to the corresponding one of the first side power pads with respect to a center point on one surface. In addition, any one of the second side ground pads may be disposed point-symmetrically to the corresponding one of the first side ground pads with respect to the center point on the one surface.

Accordingly, when the lower semiconductor chip 200 and the upper semiconductor chip 300 are sequentially stacked on the package substrate 100 in a direction perpendicular to the package substrate 100, the first side first and second pawer pads 220aP1 and 220aP2 of the lower semiconductor chip 200 and the second side first and second pawer pads 320bP1 and 320bP2 of the upper semiconductor chip 300 may overlap each other, and the first side first and second ground pads 220aG1 and 220aG2 of the lower semiconductor chip 200 and the second side first and second ground pads 320bG1 and 320bG2 of the upper semiconductor chip 300 may overlap each other. In addition, the second side first and second pawer pads 220bP1 and 220bP2 of the lower semiconductor chip 200 and the first side first and second pawer pads 320aP1 and 320aP2 of the upper semiconductor chip 300 may overlap each other, and the second side first and second ground pads 220bG1 and 220bG2 of the lower semiconductor chip 200 and the first side first and second ground pads 320aG1 and 320aG2 of the upper semiconductor chip 300 may overlap each other.

As a result, the same types of power pads and ground pads that overlap each other of the lower semiconductor chip 200 and the upper semiconductor chip 300 may be commonly connected to the corresponding power fingers and ground fingers of the package substrate 100, respectively. As an example, the first side first power pad 220aP1 of the lower semiconductor chip 200 and the second side first power pad 320bP1 of the upper semiconductor chip 300 may be commonly wire-bonded to the first side first power finger 120aP1 of the first bond finger array 120a of the package substrate 100. The first side second power pad 220aP2 of the lower semiconductor chip 200 and the second side second power pad 320bP2 of the upper semiconductor chip 300 may be commonly wire-bonded to the first side second power finger 120aP2 of the first bond finger array 120a of the package substrate 100. Similarly, the first side first ground pad 220aG1 of the lower semiconductor chip 200 and the second side first ground pad 320bG1 of the upper semiconductor chip 300 may be commonly wire-bonded to the first side first ground finger 120aG1 of the first bond finger array 120a of the package substrate 100. The first side second ground pad 220aG2 of the lower semiconductor chip 200 and the second side second ground pad 320bG2 of the upper semiconductor chip 300 may be commonly wire-bonded to the first side second ground finger 120aG2 of the first bond finger array 120a of the package substrate 100.

In the same way, the second side first power pad 220bP1 of the lower semiconductor chip 200 and the first side first power pad 320aP1 of the upper semiconductor chip 300 may be commonly wire-bonded to the second side first power finger 120bP1 of the second bond finger array 120b of the package substrate 100. The second side second power pad 220bP2 of the lower semiconductor chip 200 and the first side second power pad 320aP2 of the upper semiconductor chip 300 may be commonly wire-bonded to the second side second power finger 120bP2 of the second bond finger array 120b of the package substrate 100. Similarly, the second side first ground pad 220bG1 of the lower semiconductor chip 200 and the first side first ground pad 320aG1 of the upper semiconductor chip 300 may be commonly wire-bonded to the second side first ground finger 120bG1 of the second bond finger array 120b of the package substrate 100. The second side second ground pad 220bG2 of the lower semiconductor chip 200 and the first side second ground pad 320aG2 of the upper semiconductor chip 300 may be commonly wire-bonded to the second side second ground finger 120bG2 of the second bond finger array 120b of the package substrate 100.

As described above, according to an embodiment of the present disclosure, the semiconductor package includes a package substrate and a plurality of semiconductor chips stacked on the package substrate. The plurality of semiconductor chips may each have the same pad arrangement. The semiconductor chip includes a chip body, first chip pads disposed at a first side portion on one surface of the chip body, and second chip pads disposed at a second side portion on the one surface.

The first chip pads may have at least one first side power pad and at least one first side ground pad. The second chip pads may have at least one second side power pad and at least one second side ground pad. In this case, any one of the second side power pads may be disposed point-symmetrically to the corresponding one of the first side power pads with respect to a reference point on one surface, and any one of the second side ground pads may be disposed point-symmetrically to the corresponding one of the first side ground pads with respect to the reference point on the one surface.

When a pair of semiconductor chips having the above-described configuration are stacked to overlap each other in a direction perpendicular to the package substrate, the first side power pads of the lower semiconductor chip and the second side power pads of the upper semiconductor chip may be disposed to overlap each other, and the first side ground pads of the lower semiconductor chip and the second side ground pads of the upper semiconductor chip may be disposed to overlap each other. The second side power pads of the lower semiconductor chip and the first side power pads of the upper semiconductor chip may be disposed to overlap each other, and the second side ground pads of the lower semiconductor chip and the first side ground pads of the upper semiconductor chip may be disposed to overlap each other.

As a result, the power pads overlapping each other of the lower semiconductor chip and the upper semiconductor chip may be wire-bonded in common to one power finger of the package substrate. Similarly, the ground pads overlapping each other of the lower semiconductor chip and the upper semiconductor chip may be wire-bonded in common to one ground finger of the package substrate.

As described above, in the embodiment of the present disclosure, the power pads and the ground pads of the upper semiconductor chip and the lower semiconductor chip can share the power fingers and the ground fingers of the package substrate. Accordingly, the numbers of the power fingers and the ground fingers disposed on the package substrate can be reduced by the number shared. Accordingly, the integration degree of the power fingers and the ground fingers on the package substrate can be improved. Therefore, spaces for arranging the power fingers and the ground fingers on the package substrate can be reduced, thereby obtaining a plane size reduction effect of the entire package. In addition, by reducing the arrangement spaces of the power fingers and the ground fingers on the package substrate, it is possible to additionally secure a space for pattern design on the package substrate. That is, it is possible to improve the degree of freedom of design for various other patterns implemented on the package substrate.

Embodiments of the present disclosure have been disclosed for illustrative purposes. Those skilled in the art will appreciate that various modifications, additions, and substitutions are possible, without departing from the scope and spirit of the present disclosure and the accompanying claims.

What is claimed is:
1. A semiconductor package comprising:
a package substrate; and
a lower semiconductor chip stacked on the package substrate; and
an upper semiconductor chip stacked on the lower semiconductor chip,
wherein each of the lower and upper semiconductor chips comprises:
a chip body;

at least one first side power pad and at least one first side ground pad that are disposed at a first side portion on one surface of the chip body; and at least one second side power pad and at least one second side ground pad that are disposed at a second side portion opposite to the first side portion on the one surface of the chip body, wherein one of the at least one second side power pad is disposed point-symmetrically to a corresponding one of the at least one first side power pad with respect to a reference point on the one surface of the chip body, and wherein one of the at least one second side ground pad is disposed point-symmetrically to a corresponding one of the at least one first side ground pad with respect to the reference point on the one surface of the chip body, wherein the package substrate further comprises:
a first bond finger array on the package substrate adjacent to the first side portion of the lower semiconductor chip, and
a second bond finger array on the package substrate adjacent to the second side portion of the lower semiconductor chip, wherein the at least one first side power pad of the lower semiconductor chip and the at least one second side power pad of the upper semiconductor chip pad are overlapped with each other to share a bond finger of the first bond finger array of the package substrate, and wherein the at least one second side power pad of the lower semiconductor chip and the at least one first side power pad of the upper semiconductor chip pad are overlapped with each other to share a bond finger of the second bond finger array of the package substrate.

2. The semiconductor package of claim 1, wherein each of the lower and upper semiconductor chips has the same pad arrangement.

3. The semiconductor package of claim 1, wherein the reference point on the one surface of the chip body is a center point of a shape of the chip body that is projected onto the one surface.

4. The semiconductor package of claim 1,
wherein the at least one first side power pad and the at least one first side ground pad are aligned in a line at the first side portion, and
wherein the at least one second side power pad and the at least one second side ground pad are aligned in a line at the second side portion.

5. The semiconductor package of claim 4, further comprising at least one signal pad disposed at the first side portion.

6. The semiconductor package of claim 5,
wherein the at least one signal pad is disposed in the same line as the at least one first side power pad and the at least one first side ground pad.

7. The semiconductor package of claim 1,
wherein the lower semiconductor chip and the upper semiconductor chip are sequentially stacked in a direction perpendicular to the package substrate and have substantially the same pad arrangement with each other,
wherein the at least one first side ground pad of the lower semiconductor chip and the at least one second side ground pad of the upper semiconductor chip overlap each other, and wherein the at least one second side ground pad of the lower semiconductor chip and the at least one first side ground pad of the upper semiconductor chip overlap each other.

8. The semiconductor package of claim 7,
wherein the first bond finger array comprises at least one first side power finger and at least one first side ground finger, and the second bond finger array comprises at least one second side power finger and at least one second side ground finger,
wherein a first side power finger of the at least one first side power finger is wire-bonded to a corresponding pad of the at least one first side power pad of the lower semiconductor chip and a corresponding pad of the at least one second side power pad of the upper semiconductor chip,
wherein a first side ground finger of the at least one first side ground finger is wire-bonded to a corresponding pad of the at least one first side ground pad of the lower semiconductor chip and a corresponding pad of the at least one second side ground pad of the upper semiconductor chip,
wherein a second side power finger of the at least one second side power finger is wire-bonded to a corresponding pad of the at least one second side power pad of the lower semiconductor chip and a corresponding pad of the at least one first side power pad of the upper semiconductor chip, and
wherein a second side ground finger of the at least one second side ground finger is wire-bonded to a corresponding pad of the at least one second side ground pad of the lower semiconductor chip and a corresponding pad of the at least one first side ground pad of the upper semiconductor chip.

9. The semiconductor package of claim 8,
wherein the first bond finger array further comprises at least one first side signal finger, and the second bond finger array further comprises at least one second side signal finger, and
wherein a first side signal finger of the at least one first side signal finger is connected to a signal pad disposed on one surface of one of the lower semiconductor chip and the upper semiconductor chip, and a second side signal finger of the at least one second side signal finger is connected to a signal pad disposed on one surface of the other of the lower semiconductor chip and the upper semiconductor chip.

10. The semiconductor package of claim 1, wherein the plurality of semiconductor chips are configured to exchange electric signals with the package substrate through independent signal paths.

11. A semiconductor package comprising:
a package substrate; and
a lower semiconductor chip stacked on the package substrate; and
an upper semiconductor chip stacked on the lower semiconductor chip,
wherein each of the lower and upper semiconductor chips comprises:
a chip body;
at least one first side power pad, at least one first side ground pad, and at least one signal pad that are disposed at a first side portion on one surface of the chip body; and
at least one second side power pad and at least one second side ground pad that are disposed at a second side portion opposite to the first side portion on the one surface of the chip body, wherein one of the at least one second side power pad is disposed point-symmetrically to a corresponding one of the at least one first side power pad with respect to a reference point on the one surface of the chip body, and wherein one of the at least one second side ground pad is disposed point-symmetrically to a corresponding one of the at least one first side ground pad with respect to the reference point on the one surface of the chip body, wherein the package substrate further comprises:
a first bond finger array on the package substrate adjacent to the first side portion of the lower semiconductor chip, and
a second bond finger array on the package substrate adjacent to the second side portion of the lower semiconductor chip, wherein the at least one first side power pad of the lower semiconductor chip and the at least one second side power pad of the upper semiconductor chip pad are overlapped with each other to share a bond finger of the first bond finger array of the package substrate, wherein the at least one second side power pad of the lower semiconductor chip and the at least one first side power pad of the upper semiconductor chip pad are overlapped with each other to share a bond finger of the second bond finger array of the package substrate.

12. The semiconductor package of claim 11, wherein each of the lower and upper semiconductor chips has the same pad arrangement.

13. The semiconductor package of claim 11, wherein the reference point on the one surface of the chip body is a center point of a shape of the chip body that is projected onto the one surface.

14. The semiconductor package of claim 11,
wherein the at least one first side power pad, the at least one first side ground pad, and the at least one signal pad are aligned in a line at the first side portion, and
wherein the at least one second side power pad and the at least one second side ground pad are aligned in a line at the second side portion.

15. The semiconductor package of claim 11,
wherein the lower and upper semiconductor chips are sequentially stacked in a direction perpendicular to the package substrate and have substantially the same pad arrangement with each other,
wherein the at least one first side ground pad of the lower semiconductor chip and the at least one second side ground pad of the upper semiconductor chip overlap each other,
and
wherein the at least one second side ground pad of the lower semiconductor chip and the at least one first side ground pad of the upper semiconductor chip overlap each other.

16. The semiconductor package of claim 15, wherein the at least one signal pad of the lower semiconductor chip and the at least one signal pad of the upper semiconductor chip do not overlap each other.

17. The semiconductor package of claim 15,
wherein the first bond finger array comprises at least one first side power finger, at least one first side ground finger, and at least one first side signal finger, and
wherein the second bond finger array comprises at least one second side power finger, at least one second side ground finger, and at least one second side signal finger.

18. The semiconductor package of claim 17,
wherein a first side power finger of the at least one first side power finger is wire-bonded to a corresponding pad of the at least one first side power pads of the lower semiconductor chip and a corresponding pad of the at least one second power pad of the upper semiconductor chip,
wherein a first side ground finger of the at least one first side ground finger is wire-bonded to a corresponding pad of the at least one first side ground pad of the lower semiconductor chip and a corresponding pad of the at least one second side ground pad of the upper semiconductor chip,
wherein a first side signal finger of the at least one first side signal finger is wire-bonded to a corresponding pad of the at least one signal pad of the lower semiconductor chip,
wherein a second side power finger of the at least one second side power finger is wire-bonded to a corresponding pad of the at least one second side power pad of the lower semiconductor chip and a corresponding pad of the at least one first side power pad of the upper semiconductor chip,
wherein a second side ground finger of the at least one second side ground finger is wire-bonded to a corresponding pad of the at least one second side ground pad of the lower semiconductor chip and a corresponding pad of the at least one first side ground pad of the upper semiconductor chip, and
wherein a second side signal finger of the at least one second side signal finger is wire-bonded to a corresponding pad of the at least one signal pad of the upper semiconductor chip.

19. A semiconductor package comprising:
a package substrate comprising a first bond finger array and a second bond finger array that are spaced apart from each other and arranged in a line, respectively;
a lower semiconductor chip disposed between the first and second bond finger arrays; and
an upper semiconductor chip disposed on the lower semiconductor chip,
wherein the lower semiconductor chip and the upper semiconductor chip have substantially the same pad arrangement with each other,
wherein each of the lower and upper semiconductor chips comprises:
a chip body;
at least one first side power pad, at least one first side ground pad, and at least one signal pad that are disposed at a first side portion on one surface of the chip body; and
at least one second side power pad and at least one second side ground pad that are disposed at a second side portion opposite to the first side portion on the one surface of the chip body,
wherein one of the at least one second side power pad is disposed point-symmetrically to a corresponding one of the at least one first side power pad with respect to a reference point on the one surface of the chip body, and one of the at least one second side ground pad is disposed point-symmetrically to a corresponding one of the at least one first side ground pad with respect to the reference point on the one surface of the chip body, and
wherein the at least one first side power pad of the lower semiconductor chip and the at least one second side power pad of the upper semiconductor chip are disposed to overlap each other to share a bond finger of the first bond finger array of the package substrate, and wherein the at least one second side power pad of the lower semiconductor chip and the at least one first side power pad of the upper semiconductor chip pad are overlapped with each other to share a bond finger of the second bond finger array of the package substrate.

* * * * *